(12) United States Patent
Park

(10) Patent No.: US 11,946,974 B2
(45) Date of Patent: Apr. 2, 2024

(54) PARALLEL BATTERY RELAY DIAGNOSTIC DEVICE AND METHOD

(71) Applicant: LG ENERGY SOLUTION, LTD., Seoul (KR)

(72) Inventor: Jong Il Park, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 39 days.

(21) Appl. No.: 17/626,678

(22) PCT Filed: Dec. 9, 2020

(86) PCT No.: PCT/KR2020/017934
§ 371 (c)(1),
(2) Date: Jan. 12, 2022

(87) PCT Pub. No.: WO2021/125678
PCT Pub. Date: Jun. 24, 2021

(65) Prior Publication Data
US 2022/0260637 A1 Aug. 18, 2022

(30) Foreign Application Priority Data

Dec. 20, 2019 (KR) .................... 10-2019-0172452

(51) Int. Cl.
*G01R 31/00* (2006.01)
*G01R 31/327* (2006.01)
(Continued)

(52) U.S. Cl.
CPC .... *G01R 31/3278* (2013.01); *H01M 10/4257* (2013.01); *H01M 10/482* (2013.01);
(Continued)

(58) Field of Classification Search
CPC ............................ G01R 31/00; G01R 31/3278
(Continued)

(56) References Cited

U.S. PATENT DOCUMENTS

2004/0061503 A1  4/2004  Morimoto
2012/0268070 A1  10/2012  Park et al.
(Continued)

FOREIGN PATENT DOCUMENTS

CN  104878295 A  6/2015
CN  109219754 A  1/2019
(Continued)

OTHER PUBLICATIONS

International Search Report for PCT/KR2020/017934 dated Mar. 18, 2021.
(Continued)

*Primary Examiner* — Vincent Q Nguyen
(74) *Attorney, Agent, or Firm* — Birch, Stewart, Kolasch & Birch, LLP

(57) ABSTRACT

Discussed is a battery relay diagnostic device adapted to diagnose a battery system including battery packs connected and a charge and discharge controller connected between the battery packs and a load part and control charge and discharge of the battery packs, the battery packs including a battery cell module including battery cells and a switching unit including a first switch provided between a positive ((+)) terminal of the battery cell module and a load part and a second switch provided between a negative ((−)) terminal of the battery cell module and the load part, the battery relay diagnostic device including: a switching controller configured to control a current applied to the battery cell module by controlling on/off of the switching unit; and a diagnostic circuit configured to perform diagnosis on the first switch and the second switch based on an on/off state of the first switch and the second switch.

13 Claims, 10 Drawing Sheets

(51) Int. Cl.
*H01M 10/42* (2006.01)
*H01M 10/48* (2006.01)
*H01M 50/512* (2021.01)
*H01M 50/569* (2021.01)
*H02J 7/00* (2006.01)

(52) U.S. Cl.
CPC ....... *H01M 10/488* (2013.01); *H01M 50/512* (2021.01); *H01M 50/569* (2021.01); *H02J 7/0013* (2013.01); *H02J 7/0047* (2013.01); *H01M 2010/4271* (2013.01)

(58) Field of Classification Search
USPC .......................................... 324/426, 432–435
See application file for complete search history.

(56) References Cited

U.S. PATENT DOCUMENTS

| | | |
|---|---|---|
| 2013/0009648 A1 | 1/2013 | Tae |
| 2013/0257440 A1 | 10/2013 | Takahashi et al. |
| 2014/0354054 A1 | 12/2014 | Katou |
| 2015/0054517 A1 | 2/2015 | Yonezaki et al. |
| 2015/0222117 A1 | 8/2015 | Im |
| 2015/0346282 A1 | 12/2015 | Jeon |
| 2016/0250928 A1* | 9/2016 | Matsuda ................ B60L 53/53 701/22 |
| 2018/0278066 A1 | 9/2018 | Kurahashi et al. |
| 2019/0267679 A1 | 8/2019 | Lee |
| 2019/0379217 A1 | 12/2019 | Song et al. |
| 2020/0185936 A1* | 6/2020 | Oishi ................... H02J 7/0024 |
| 2021/0005938 A1* | 1/2021 | Hayashi ............. H01M 50/249 |

FOREIGN PATENT DOCUMENTS

| | | |
|---|---|---|
| CN | 110199454 A | 9/2019 |
| EP | 2 645 518 A2 | 12/2013 |
| JP | 4934628 B2 | 5/2012 |
| JP | 2014-93806 A | 5/2014 |
| JP | 5508180 B2 | 5/2014 |
| JP | 2014-143796 A | 8/2014 |
| JP | 5751282 B2 | 7/2015 |
| JP | 5768780 B2 | 8/2015 |
| JP | 2016-219229 A | 12/2016 |
| JP | 2018-50400 A | 3/2018 |
| JP | 2018-163100 A | 10/2018 |
| JP | 2019-164897 A | 9/2019 |
| JP | 6569623 B2 | 9/2019 |
| JP | 2019-204787 A | 11/2019 |
| KR | 10-2012-0107302 A | 10/2012 |
| KR | 10-2013-0020455 A | 2/2013 |
| KR | 10-2014-0007599 A | 1/2014 |
| KR | 10-1460845 B1 | 11/2014 |
| KR | 10-1498458 B1 | 3/2015 |
| KR | 10-2015-0091890 A | 8/2015 |
| KR | 10-1602434 B1 | 3/2016 |

OTHER PUBLICATIONS

Extended European Search Report for European Application No. 20902610.3, dated Nov. 28, 2022.

* cited by examiner

PARALLEL BATTERY RELAY DIAGNOSTIC DEVICE AND METHOD

CROSS-REFERENCE TO RELATED APPLICATIONS

This application claims the benefit of Korean Patent Application No. 10-2019-0172452, filed on Dec. 20, 2019, in the Korean Intellectual Property Office, the disclosure of which is incorporated herein in its entirety by reference.

TECHNICAL FIELD

The present disclosure relates to a device and method for diagnosing a relay of a plurality of battery packs connected in parallel.

BACKGROUND ART

In recent years, research and development for secondary batteries have been actively conducted. Here, the secondary battery is a battery capable of recharging and discharging, and in its meaning, includes all of the existing Ni/Cd battery, the Ni/MH battery, and the like and a recent lithium-ion battery. Among secondary batteries, lithium-ion batteries have the advantage of having much higher energy density than the existing Ni/Cd batteries and Ni/MH batteries. In addition, lithium-ion batteries may be manufactured in a small size and light weight, and accordingly, may be used as power sources for mobile devices. In addition, the lithium-ion batteries have expanded their range of use to power sources for electric vehicles, making the batteries attract attention as a next-generation energy storage medium.

In addition, the secondary battery is generally used as a battery pack including a battery module in which a plurality of battery cells are connected in series and/or in parallel. The state and operation of the battery pack are managed and controlled by a battery management system.

The battery pack uses a pre-charge circuit that includes a pre-charge relay and a pre-charge resistor to protect a positive relay. However, in the parallel-connection battery pack structure, the pre-charge circuits are redundantly used, resulting in an increase in manufacturing cost and unnecessarily complex control logic to be applied.

On the other hand, in the parallel-connection battery pack structure in the related art, if a relay control used for one battery and a diagnostic logic are used, interference may occur between packs connected in parallel, which may lead to misdiagnosis.

DISCLOSURE OF THE INVENTION

Technical Problem

The present disclosure has been made to solve the above-mentioned problems, and an object of the present disclosure is to provide a battery relay diagnostic device and method capable of reducing cost and simplifying a control logic by minimizing a configuration of a pre-charge circuit of battery packs connected in parallel, and preventing misdiagnosis by performing diagnosis according to a state of each relay in consideration of the effect of interference from other battery packs connected in parallel.

Technical Solution

A battery relay diagnostic device according to an embodiment of the present disclosure is a battery relay diagnostic device for diagnosing a battery system including a plurality of battery packs connected in parallel, and a charge and discharge controller connected between the plurality of battery packs and a load part and controlling charge and discharge of the plurality of battery packs, the battery pack includes a battery cell module including a plurality of battery cells, and a switching unit including a first switch provided between a positive ((+)) terminal of the battery cell module and a load part and a second switch provided a negative ((−)) terminal of the battery cell module and the load part, and the battery relay diagnostic device includes a switching controller controlling a current applied to the battery cell module by controlling on/off of the switching unit and a diagnostic unit performing diagnosis on the first switch and the second switch based on an on/off state of the first switch and the second switch.

A battery relay diagnostic method according to an embodiment of the present disclosure is a diagnostic method for a battery system including a plurality of battery packs, the battery system including a charge and discharge controller connected between the battery packs connected in parallel and a load part and controlling charge and discharge of battery cell modules included in the battery packs, and the battery packs including the battery cell module including a plurality of battery cells and a switching unit including a first switch provided between a positive ((+)) terminal of the battery cell module and the load part and a second switch provided between a negative ((−)) terminal of the battery cell module and the load part, and the method includes performing diagnosis on the first switch and the second switch based on an on/off state of the first switch and the second switch.

Effects of the Invention

According to the battery relay diagnostic device and method, it is possible to reduce cost and simplify control logic by minimizing the configuration of the pre-charge circuit of battery packs connected in parallel, and to prevent misdiagnosis by performing diagnosis according to a state of each relay in consideration of the effect of interference from other battery packs connected in parallel.

BRIEF DESCRIPTION OF THE DRAWINGS

FIG. 5A is a diagram illustrating a relay configuration of a battery system according to an embodiment of the present disclosure and an interference when relays are on, and FIG. 5B is a diagram illustrating a relay control method for the battery system when positive and negative relays are on.

MODE FOR CARRYING OUT THE INVENTION

Figure 1:
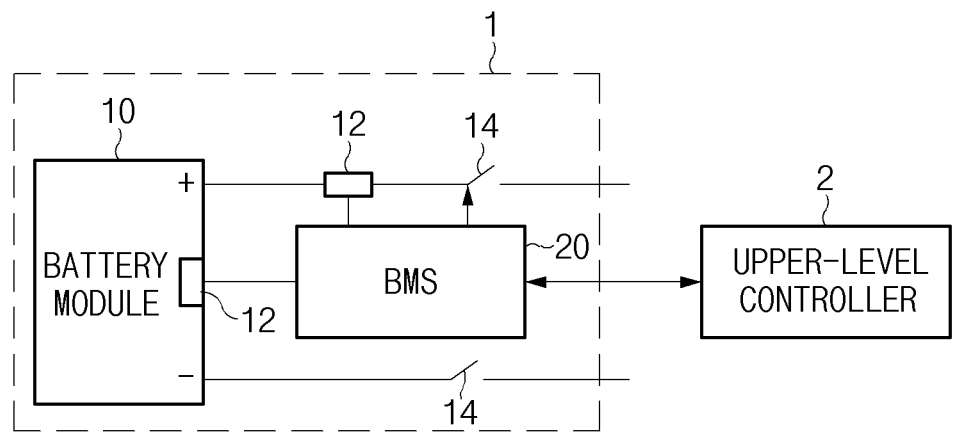
FIG. 1 a block diagram illustrating a configuration of a single battery control system.

Hereinafter, various embodiments of the present disclosure will be described in detail with reference to the accompanying drawings. In the present disclosure, the same reference numerals are used for the same elements in the drawings, and duplicate descriptions for the same elements are omitted.

In various embodiments of the present disclosure disclosed herein, specific structural or functional descriptions are merely exemplary for the purpose of describing embodiments of the present disclosure, and various embodiments of the present disclosure may be implemented in various forms and should not be construed as being limited to the embodiments described herein.

As used in various embodiments, the terms such as "first", "second", "the first", or "the second" may modify various components, regardless of order and/or importance, but do not limit the components. For example, without departing from the scope of the present disclosure, a first element could be termed a second element, and similarly, in reverse, a second element could be termed a first element.

The terms and phrases as used herein are merely provided to describe specific embodiments, and may not be intended to limit the scope of other embodiments. A singular form is intended to include a plural form, unless the context clearly indicates otherwise.

All terms, including technical or scientific terms, as used here, may have the same meaning as commonly understood by a person skilled in the art to which the present disclosure belongs. Terms such as those defined in commonly-used dictionaries should be interpreted as having a meaning that is consistent with their meaning in the context of the relevant art and will not be interpreted in an idealized or overly formal sense unless expressly so defined here. In some cases, even terms defined here cannot be interpreted to exclude embodiments of the present disclosure.

FIG. 1 is a block diagram illustrating a configuration of a single battery control system.

Referring to FIG. 1, a battery control system including a battery pack 1 according to an embodiment of the present disclosure and an upper-level controller 2 included in an upper-level system is schematically illustrated.

As illustrated in FIG. 1, the battery pack 1 may be made of one or more battery cells, and may include a rechargeable battery module 10, a switching unit 14 connected to a (+) terminal or a (−) terminal of the battery module 10 in series to control a charge and discharge current flow of the battery module 10, and a battery management system 20 for controlling and managing by monitoring voltage, current, temperature, or the like of the battery pack 1 to prevent over-charging, over-discharging, or the like.

Here, the switching unit 14 is a switching element for controlling a current flow for charging or discharging of the battery module 10, and generally uses a relay, but may include a semiconductor switching element. For example, at least one relay or one metal-oxide-semiconductor field-effect transistor (MOSFET) may be used.

In addition, the battery management system (BMS) 20 may monitor the voltage, current, temperature, or the like, of the battery pack 1 in order to ensure the safety of the battery, and to this end, may directly receive the values or use a sensor 12 to measure the current, voltage, temperature, or the like, of the battery pack. The BMS 20 may be an interface for receiving values obtained by measuring the above-mentioned various parameters, and may include a plurality of terminals, a circuit connected to the terminals to process input values, or the like.

In addition, the BMS 20 may control ON/OFF of the switching element 14, for example, a relay or a MOSFET, and may be connected to the battery module 10 to monitor the status of the battery module 10.

The upper-level controller 2 may transmit a control signal for the battery module to the BMS 20. Accordingly, the operation of the BMS 20 may be controlled based on the signal applied from the upper-level controller. The battery cell described in the present disclosure may be included in a battery pack used in an energy storage system (ESS), a vehicle, or the like. However, it is not limited to the above-mentioned uses.

The configuration of the battery pack 1 and the configuration of the BMS 20 are known, and thus a more detailed description will be omitted.

Figure 2:
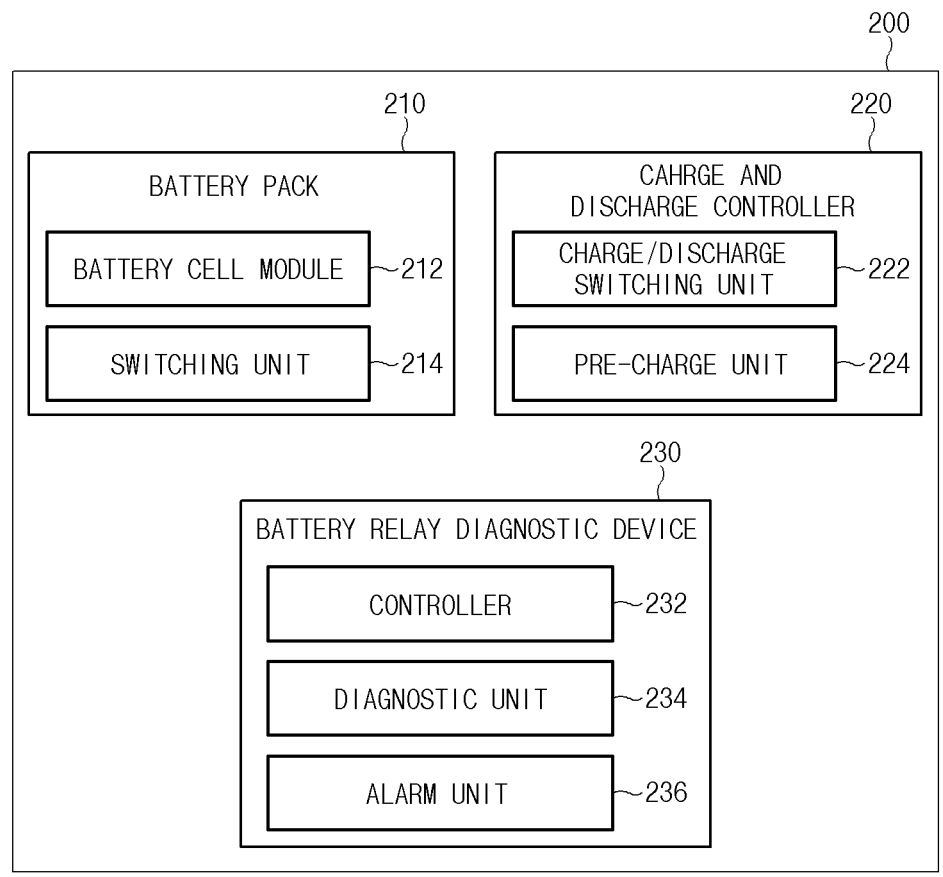
FIG. 2 is a block diagram illustrating a configuration of a battery system including a battery relay diagnostic device according to an embodiment of the present disclosure.

FIG. 2 is a block diagram illustrating a configuration of a battery system including a battery relay diagnostic device according to an embodiment of the present disclosure.

Referring to FIG. 2, a battery system 200 according to an embodiment of the present disclosure may include a plurality of battery packs 210, a charge and discharge controller 220, and a battery relay diagnostic device 230.

The plurality of battery packs 210 may be connected in parallel, and each may be connected to the charge and discharge controller 220. Only one charge and discharge controller 220 may be provided regardless of the number of battery packs 210 connected in parallel. In this case, each of the battery packs 210 may include a battery cell module 212 and a switching unit 214.

The battery cell module 212 may include a plurality of battery cells connected in series or in parallel.

The switching unit 214 may include a first switch provided between a (+) terminal of the battery cell module 212 and a load part and a second switch provided between a (−) terminal of the battery cell module and the load part.

The charge and discharge controller 220 may control charge and discharge of a plurality of battery packs 210 connected in parallel. In this case, the charge and discharge controller 220 may include a charge/discharge switching unit 222 and a pre-charge unit 224. In addition, the charge and discharge controller 220 may include only one pre-charge circuit.

The charge/discharge switching unit 222 may include a positive relay connected to the (+) side of the battery pack 210 connected to others in parallel and a negative relay connected to the (−) side of the battery pack 210 connected to others in parallel. The charge/discharge switching unit 222 may control the positive relay and the negative relay to control a current flow applied between the battery pack 210 and a load part.

The pre-charge unit 224 may include a pre-charge circuit in which a pre-charge resistor and a pre-charge relay are connected in series, and may be connected in parallel to the positive relay of the charge/discharge switching unit 222. The pre-charge unit 224 may protect the positive relay by controlling a speed during initial charging of the battery pack 210.

The battery relay diagnostic device 230 may diagnose the battery pack 210 included in the battery pack 210 about whether it operates normally. In this case, the battery relay diagnostic device 230 may include a switching controller 232, a diagnostic unit 234, and an alarm unit 236.

The switching controller 232 may control the current applied to the battery cell module 212 by controlling on/off of the switching unit 214 and the charge/discharge switching unit 222 of the battery pack 210. That is, according to the present disclosure, by diagnosing the switching unit 214 of the battery pack 210, the switching controller 232 may control on/off of the first switch provided between the (+) terminal of the battery cell module 212 and the load part and the second switch provided between the (−) terminal of the battery cell module and the load part, thereby controlling the current applied to the battery cell module 212, and the diagnostic unit 234 may diagnose the first switch and the second switch about whether they operate normally.

The diagnostic unit 234 may perform diagnosis on the first switch and the second switch based on the on/off states of the first switch and the second switch. The diagnostic unit 234 may perform diagnosis on the first switch and the second switch in an order determined in consideration of interference between the plurality of battery packs 210 connected in parallel as will be described later.

Specifically, the diagnostic unit 234 may perform diagnosis by simultaneously measuring a voltage across the first switch for the plurality of battery packs 210 when both the first switch and the second switch are in an off state, and may perform diagnosis by sequentially measuring a voltage across a terminal of the first switch close to a (+) side of the battery cell module 212 and a terminal of the second switch close to the load part for each of the plurality of battery packs 210.

Furthermore, the diagnostic unit 234 may perform diagnosis by simultaneously measuring the voltage across the terminal of the first switch close to the (+) side of the battery cell module 212 and the terminal of the second switch close to the load part for the plurality of battery packs 210 when the first switch is in the off state and the second switch is in the on state. In addition, the diagnostic unit 234 may perform diagnosis by sequentially measuring the voltage across the first switch for each of the plurality of battery packs when both the first switch and the second switch are in the on state.

The alarm unit 236 may generate a warning notification when it is determined that an abnormality occurs in at least one of the first switch and the second switch of the plurality of battery packs 210 by the diagnostic unit 234.

As described above, with the battery relay diagnostic device of the present disclosure, it is possible to reduce cost and simplify control logic by minimizing the configuration of the pre-charge circuit of battery packs connected in parallel, and to prevent misdiagnosis by performing diagnosis depending on a state of each relay in consideration of the effect of interference from other battery packs connected in parallel.

Figure 3A:
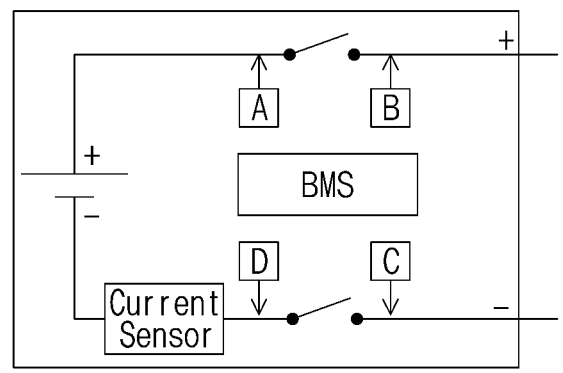
FIG. 3A is a diagram illustrating a relay configuration of a battery system in the related art.
Figure 3B:
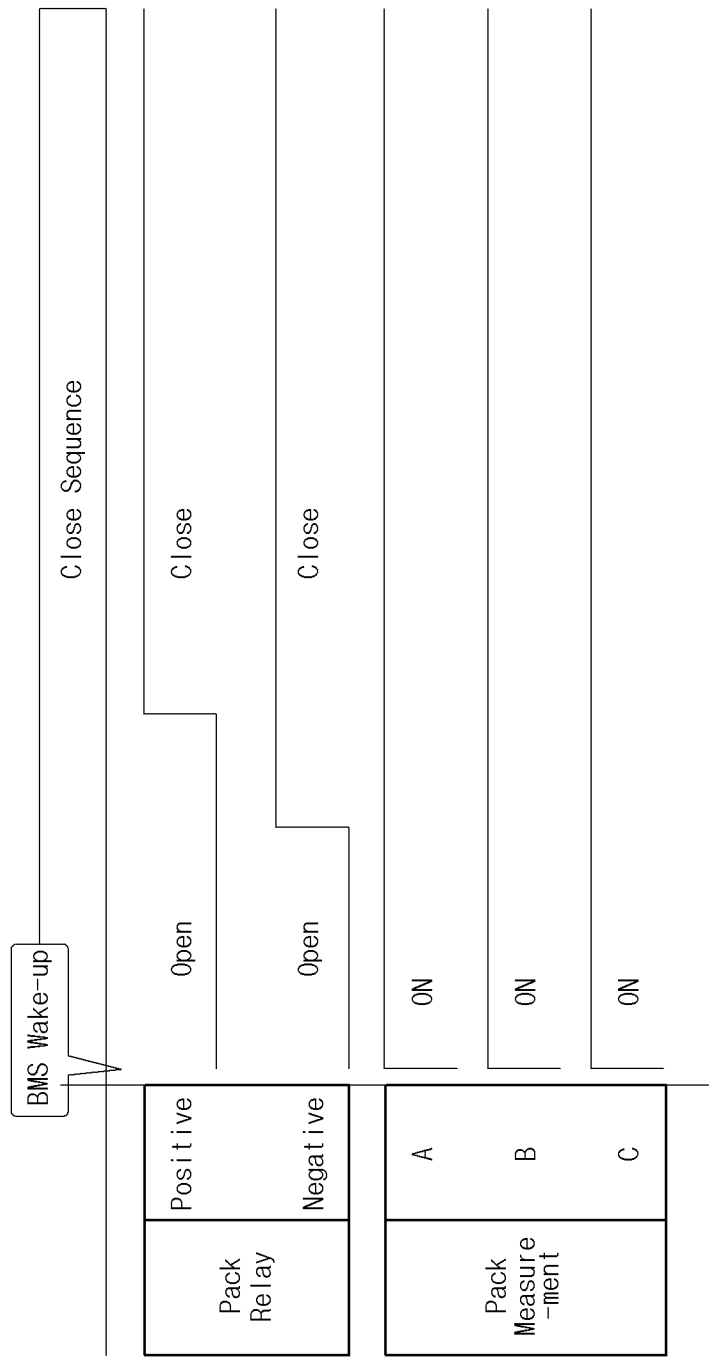
FIG. 3B is a diagram illustrating a relay control method for the battery system in the related art.

FIG. 3A is a diagram illustrating a relay configuration of a battery system in the related art, and FIG. 3B is a diagram illustrating a relay control method for the battery system in the related art.

As illustrated in FIG. 3A, the battery system in the related art generally includes a single pack structure and eliminates the pre-charge circuit to reduce costs. Therefore, as illustrated in FIG. 3B, the battery management system (BMS) performs diagnosis on relays by measuring the voltages at each of points A, B, and C after waking up, regardless of the on/off state of each relay.

However, when a plurality of single packs illustrated in FIGS. 3A and 3B are connected in parallel, it is likely that misdiagnosis occurs since relays interfere with each other. Therefore, a new relay control and diagnosis method is required in battery packs having a parallel structure.

Figure 4A:
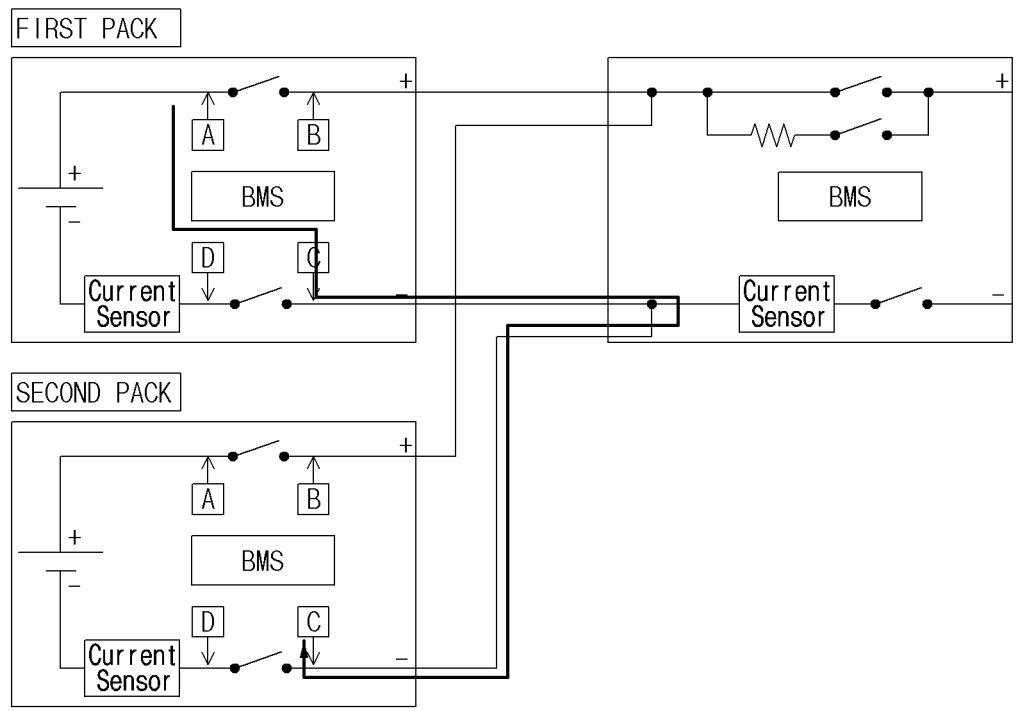
FIG. 4A is a diagram illustrating a relay configuration of a battery system according to an embodiment of the present disclosure and an interference when relays are off.
Figure 4B:
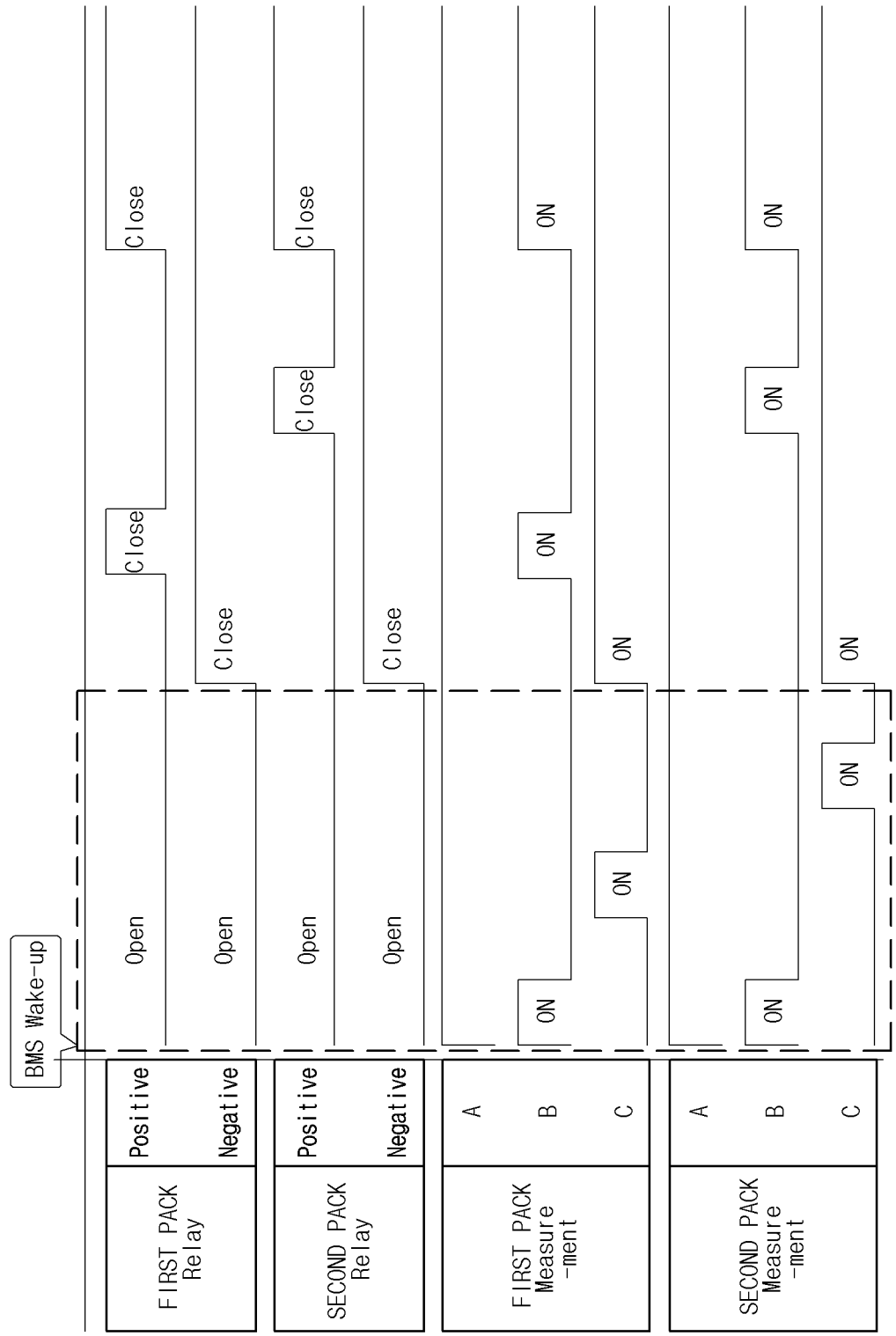
FIG. 4B is a diagram illustrating a relay control method for the battery system when positive and negative relays are off.

FIG. 4A is a diagram illustrating a relay configuration of a battery system according to an embodiment of the present disclosure and an interference when relays are off, and FIG. 4B is a diagram illustrating a relay control method for the battery system when the first switch and the second switch are off.

Referring to FIGS. 4A and 4B, in the battery system according to an embodiment of the present disclosure, interference may occur between battery packs connected in parallel, and diagnosis is performed by classifying each battery pack according to the on/off state of the relay.

Specifically, referring to FIG. 4B, when both the first switch and the second switch of the battery pack are in the off state, the battery pack voltage is applied to points A of a first pack and a second pack of FIG. 4A and a B voltage is 0V, which does not affect both battery packs, and thus the measurement of the B voltage may be simultaneously performed for a plurality of battery packs.

On the other hand, in the case of measuring a C voltage while both the first switch and the second switch of the battery pack are in the off state, diagnosis is performed by connecting points A and C, and in this case, as indicated by an arrow (solid line) in FIG. 4A, interference between the first pack and the second pack may occur. Therefore, as illustrated in FIG. 4B, the C voltage has to be sequentially measured for each battery pack.

Figure 5A:
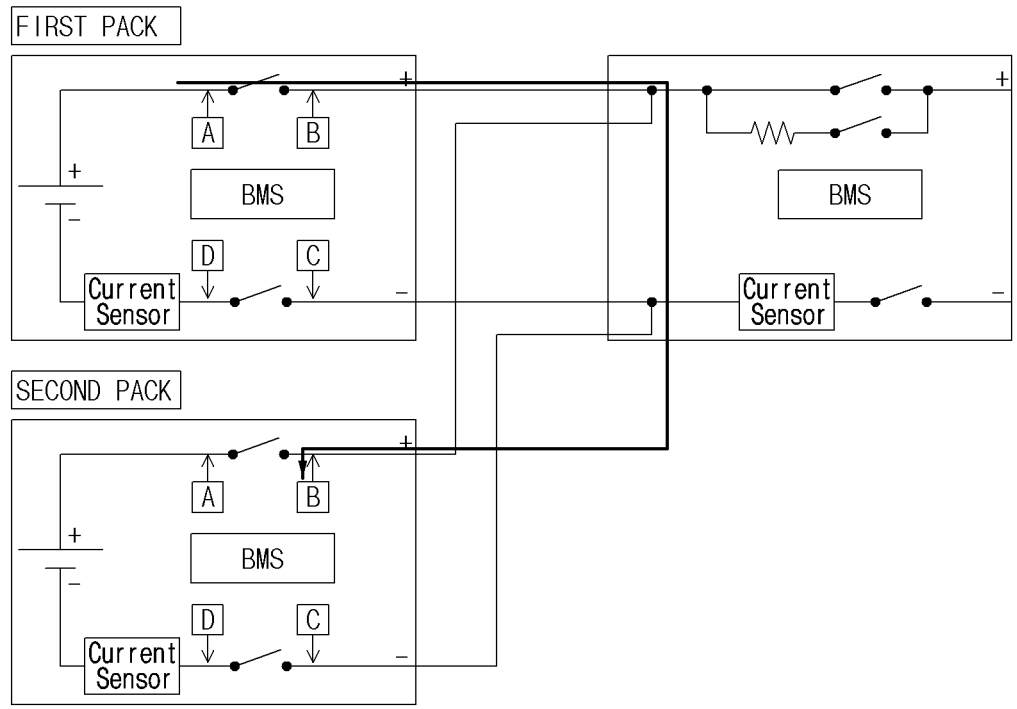
Figure 5B:
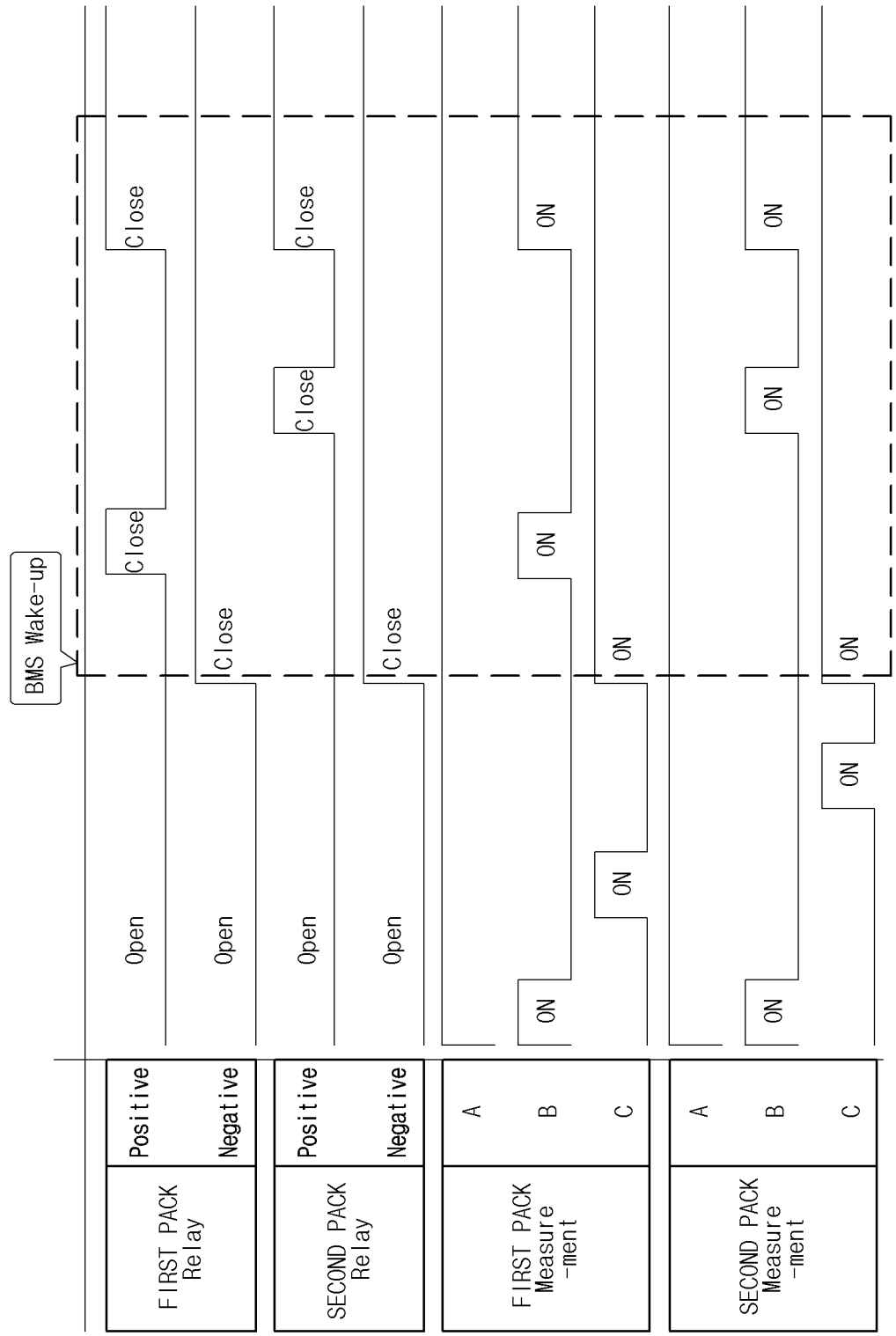

FIG. 5A is a diagram illustrating a relay configuration of a battery system according to an embodiment of the present disclosure and an interference when relays are on, and FIG. 5B is a diagram illustrating a relay control method for the battery system when the first switch and the second switch are on.

Referring to FIG. 5B, when the first switch of the battery pack is in the off state and the second switch is in the on state, a C voltage and a D voltage of a first pack and a second pack of FIG. 5A are ground voltages and 0V is applied, which does not affect the battery packs, and thus the measurement of the C voltage may be simultaneously performed for a plurality of battery packs.

On the other hand, in the case of measuring the B voltage while both the first switch and the second switch of the battery pack are in the on state, a battery pack voltage are applied to both the A voltage and the B voltage, and, in this case, as indicated by an arrow (solid line) in FIG. 5A, interference between the first pack and the second pack may occur. Therefore, as illustrated in FIG. 5B, the B voltage has to be sequentially measured for each battery pack.

As described above, with the battery relay diagnostic device according to an embodiment of the present disclosure, it is possible to solve the problem of misdiagnosis by the influence between battery packs by performing diagnosis simultaneously or sequentially in consideration of interference by the on/off states of the relays of each battery pack.

Figure 6:
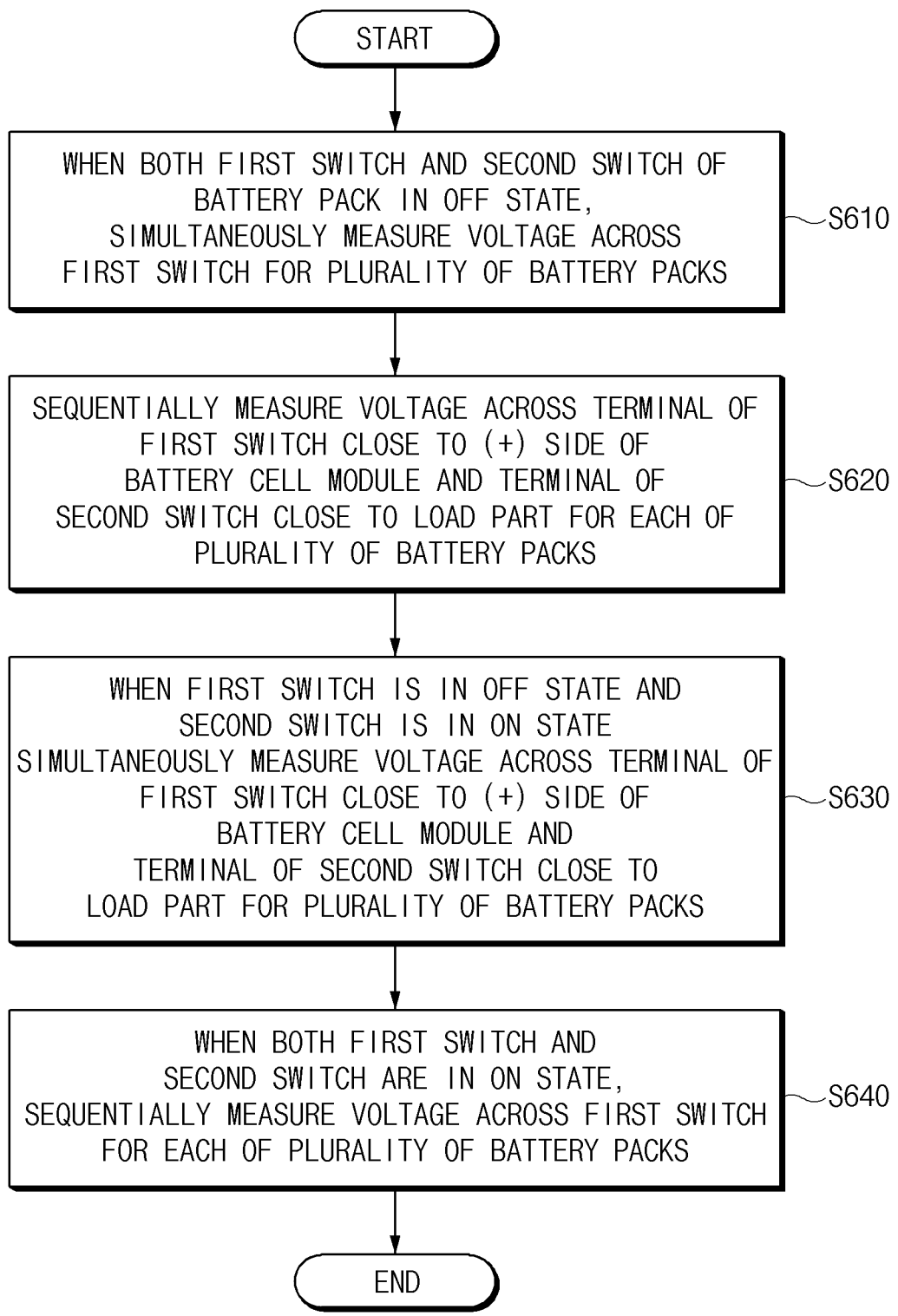
FIG. 6 is a flowchart illustrating a battery relay diagnostic method according to an embodiment of the present disclosure.

FIG. 6 is a flowchart illustrating a battery relay diagnostic method according to an embodiment of the present disclosure.

A battery relay diagnostic method according to an embodiment of the present disclosure, which is illustrated in FIG. 6, is a diagnostic method for a battery system including a charge and discharge controller connected between a plurality of battery packs connected in parallel and a load part and controlling charge and discharge of battery cell modules included in the battery packs, and the battery packs including the battery cell module including a plurality of battery cells and a switching unit including a first switch provided between a positive (+) terminal of the battery cell module and the load part and a second switch provided between a negative (−) terminal of the battery cell module and the load part. In this case, the charge and discharge controller may include only one pre-charge circuit.

In addition, the battery relay diagnostic method may be a diagnostic method of performing diagnosis based on the on/off state of relays included in the battery pack (e.g., whether or not there is interference between the battery packs).

Referring to FIG. 6, a voltage across the first switch are simultaneously measured for the plurality of battery packs when both the first switch and the second switch are open and are in the off state (S610).

Then, when the first switch and the second switch are in the off state, a voltage across a terminal of the first switch close to a (+) side of the battery cell module and a terminal of the second switch close to the load part is sequentially measured for each of the plurality of battery packs (S620).

Then, when the first switch is in the off state and the second switch is closed and is in the on state, the voltage across the terminal of the first switch close to the (+) side of the battery cell module and the terminal of the second switch close to the load part is simultaneously measured for the plurality of battery packs (S630).

Then, when both the first switch and the second switch are closed and are in the on state, the voltage across the first switch is sequentially measured for each of the plurality of battery packs (S640).

On the other hand, although not illustrated in FIG. 6, the battery relay diagnostic method according to an embodiment of the present disclosure may include generating a warning notification when the diagnostic unit determines that an abnormality occurs in at least one of the first switch and the second switch in the plurality of battery packs.

As described above, with the battery relay diagnostic method of the present disclosure, it is possible to reduce cost and simplify control logic by minimizing the configuration of the pre-charge circuit of battery packs connected in parallel, and to prevent misdiagnosis by performing diagnosis according to a state of each relay in consideration of the effect of interference from other battery packs connected in parallel.

Figure 7:
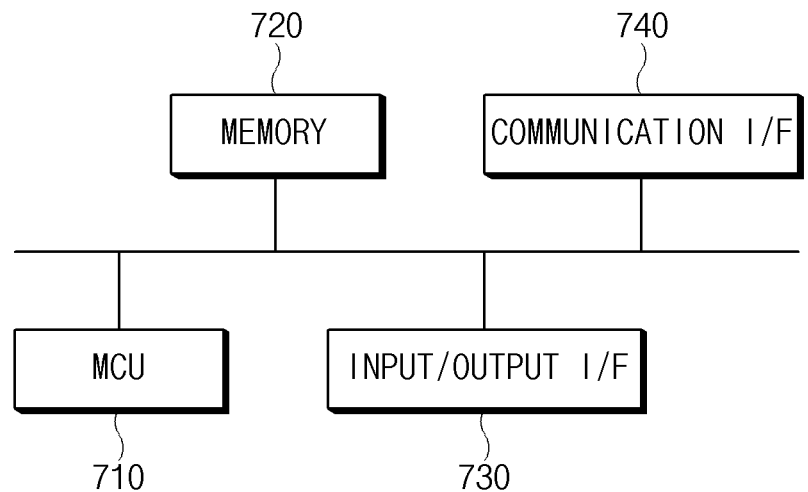
FIG. 7 is a diagram illustrating a hardware configuration of a battery relay diagnostic device according to an embodiment of the present disclosure.

FIG. 7 is a diagram illustrating a hardware configuration of a battery relay diagnostic device according to an embodiment of the present disclosure.

Referring to FIG. 7, a battery relay diagnostic device 700 may include a microcontroller (MCU) 710 controlling various processes and configurations, a memory 720 in which operating system programs and various programs (e.g., a battery relay diagnostic algorithm program capable of diagnosing the state of the first switch and the second switch, and a battery switching control program capable of controlling a switch in the battery pack) are recorded, an input/output interface 730 for providing an input interface and an output interface through which data of the battery cell module and/or the switching element, such as voltage, current, and temperature, can flow, and a communication interface 740 capable of communicating with the outside through a wired or wireless communication network. As described above, the computer program according to the present disclosure may be recorded in the memory 720 and processed by the microcontroller 710, so that it may be implemented as a module that performs each functional block illustrated in FIG. 2.

In the above, the present disclosure has been described as a structure without the pre-charge circuit in the battery pack; however, the principle applied to the present disclosure is to be applied in the same way even for a battery with a pre-charge.

In the description above, although all components constituting the aspects of the present disclosure have been described as being combined into one unit or operated in combination, the present disclosure is not necessarily limited to such aspects. That is, within the objective scope of the present disclosure, one or more components may be selectively and operatively combined in any number.

In addition, terms such as "include", "comprise", or "have" described above mean that the corresponding component can be present unless otherwise stated, and thus it should be construed that other components may be further included rather than excluding other components. All terms including technical or scientific terms have the same meaning as commonly understood by those of ordinary skill in the art to which the embodiments of the present disclosure belong, unless otherwise defined. Terms commonly used such as those defined in dictionaries should be interpreted as having a meaning that is consistent with their meaning in the context of the related art and will not be interpreted in an idealized or overly formal sense unless expressly so defined in the present disclosure.

The above description is merely illustrative of the technical idea of the present disclosure, and those of ordinary skill in the art to which the present disclosure pertains will be able to make various modifications and variations without departing from the essential characteristics of the present disclosure. Accordingly, the embodiments disclosed in the present disclosure are not intended to limit the technical idea of the present disclosure, but to explain the technical idea, and the scope of the technical idea of the present disclosure is not limited by these embodiments. The scope of protection of the present disclosure should be interpreted by the accompanying claims, and all technical ideas within the scope equivalent thereto should be construed as being included in the scope of the present disclosure.

The invention claimed is:

1. A battery relay diagnostic device adapted to diagnose a battery system including a plurality of battery packs connected in parallel and a charge and discharge controller connected between the plurality of battery packs and a load part and controls charge and discharge of the plurality of battery packs, the battery packs including a battery cell module including a plurality of battery cells and a switching unit including a first switch provided between a positive ((+)) terminal of the battery cell module and a load part and a second switch provided between a negative ((−)) terminal of the battery cell module and the load part, the battery relay diagnostic device comprising:

a switching controller configured to control a current applied to the battery cell module by controlling on/off of the switching unit; and a diagnostic circuit configured to perform diagnosis on the first switch and the second switch based on an on/off state of the first switch and the second switch, wherein the diagnostic unit is configured to:

perform diagnosis sequentially on at least one switch generating an interference between the plurality of battery packs among the first switch and the second switch for each of the plurality of battery packs, based on the on/off state, and perform diagnosis simultaneously on at least one switch not generating the interference between the plurality of battery packs among the first switch and the second switch in all of the plurality of the battery packs, based on the on/off state.

2. The battery relay diagnostic device of claim 1, wherein the diagnostic circuit is configured to perform diagnosis on the first switch and the second switch in an order determined in consideration of the interference between the plurality of battery packs.

3. The battery relay diagnostic device of claim 2, wherein the diagnostic circuit is configured to perform diagnosis by simultaneously measuring a voltage across the first switch for the plurality of battery packs when both the first switch and the second switch are in an off state, and perform diagnosis by sequentially measuring a voltage across a terminal of the first switch close to a positive (+) side of the battery cell module and a terminal of the second switch close to the load part for each of the plurality of battery packs.

4. The battery relay diagnostic device of claim 3, wherein the diagnostic circuit is configured to perform diagnosis by simultaneously measuring the voltage across the terminal of the first switch close to the positive (+) side of the battery cell module and the terminal of the second switch close to the load part for the plurality of battery packs when the first switch is in the off state and the second switch is in an on state.

5. The battery relay diagnostic device of claim 4, wherein the diagnostic circuit is configured to perform diagnosis by sequentially measuring the voltage across the first switch for each of the plurality of battery packs when both the first switch and the second switch are in the on state.

6. The battery relay diagnostic device of claim 1, further comprising an alarm configured to generate a warning notification when the diagnostic circuit determines that an abnormality occurs in at least one of the first switch and the second switch in the plurality of battery packs.

7. The battery relay diagnostic device of claim 1, wherein terminals of the first switches in the plurality of battery packs close to the load part are connected to each other, and terminals of the second switches in the plurality of battery packs close to the load part are connected to each other.

8. The battery relay diagnostic device of claim 1, wherein the charge and discharge controller includes only one pre-charge circuit.

9. A battery relay diagnostic method for diagnosing a battery system including a plurality battery packs, a charge and discharge controller connected between the battery packs connected in parallel, and a load part, the charge and discharge controller configured to control charge and discharge of battery cell modules included in the battery packs, the battery packs including the battery cell module including a plurality of battery cells and a switching unit, and the switching unit including a first switch provided between a positive ((+)) terminal of the battery cell module and the load part and a second switch provided between a negative ((−)) terminal of the battery cell module and the load part, the diagnostic method comprising:
performing diagnosis on the first switch and the second switch based on an on/off state of the first switch and the second switch,
wherein the performing diagnosis on the first switch and the second switch includes:
performing diagnosis sequentially on at least one switch generating an interference between the plurality of battery packs among the first switch and the second switch for each of the plurality of battery packs, based on the on/off state, and
performing diagnosis simultaneously on at least one switch not generating the interference between the plurality of battery packs among the first switch and the second switch in all of the plurality of the battery packs, based on the on/off state.

10. The battery relay diagnostic method for diagnosing a battery system of claim 9, wherein the performing of diagnosis on the first switch and the second switch includes performing diagnosis on the first switch and the second switch in an order determined in consideration of the interference between the plurality of battery packs.

11. The battery relay diagnostic method of claim 10, wherein the performing of diagnosis on the first switch and the second switch includes:
simultaneously measuring a voltage across the first switch for the plurality of battery packs when both the first switch and the second switch are in an off state; and
sequentially measuring a voltage across a terminal of the first switch close to a positive (+) side of the battery cell module and a terminal of the second switch close to the load part for each of the plurality of battery packs.

12. The battery relay diagnostic method of claim 11, wherein the performing of diagnosis on the first switch and the second switch includes simultaneously measuring the voltage across the terminal of the first switch close to the positive (+) side of the battery cell module and the terminal of the second switch close to the load part for the plurality of battery packs when the first switch is in the off state and the second switch is in an on state.

13. The battery relay diagnostic method of claim 12, wherein the performing of diagnosis on the first switch and the second switch includes sequentially measuring the voltage across the first switch for each of the plurality of battery packs when both the first switch and the second switch are in the on state.

* * * * *